United States Patent [19]

Sanada et al.

[11] Patent Number: 5,005,141
[45] Date of Patent: Apr. 2, 1991

[54] PHASE-LOCKED LOOP CIRCUIT

[75] Inventors: Kazunori Sanada; Jyoji Kawai, both of Hyogo, Japan

[73] Assignee: Mitsubishi Denki Kabushiki Kaisha, Tokyo, Japan

[21] Appl. No.: 334,471

[22] Filed: Apr. 7, 1989

[30] Foreign Application Priority Data

Apr. 25, 1988 [JP] Japan .................. 63-102012

[51] Int. Cl.$^5$ .................. G06F 15/20; H03K 5/13
[52] U.S. Cl. .................. 364/550; 307/262; 328/155; 331/25; 364/481
[58] Field of Search .................. 331/1A, 11, 16, 17, 331/18, 25, 176, DIG. 2, 45; 328/134, 155; 307/262; 364/550, 484, 718–721, 400, 486, 481

[56] References Cited

U.S. PATENT DOCUMENTS

| | | | |
|---|---|---|---|
| 4,310,891 | 1/1982 | Niki | 364/484 |
| 4,646,004 | 2/1987 | Brandt et al. | 328/155 |
| 4,672,299 | 6/1987 | Grimes et al. | 364/484 |
| 4,715,000 | 12/1987 | Premerlani | 364/484 |
| 4,723,216 | 2/1988 | Premerlani | 364/484 |
| 4,752,748 | 6/1988 | Graeszykowski | 331/45 |
| 4,807,146 | 2/1989 | Goodrich et al. | 364/484 |
| 4,847,870 | 7/1989 | Butcher | 328/115 |
| 4,864,253 | 9/1989 | Zwack | 331/25 |
| 4,897,778 | 1/1990 | Miyamoto et al. | 364/400 |

Primary Examiner—Kevin J. Teska
Attorney, Agent, or Firm—Rothwell, Figg, Ernst & Kurz

[57] ABSTRACT

A phase-locked loop circuit adapted to produce a stable output signal having the same frequency and phase as those of an input signal. Phase comparator means measures the time difference between the rising edge of the input signal and the falling edge of the feedback signal, and calculator means executes a phase control calculation twice per cycle on the basis of the measured time difference. Then a variable-frequency oscillator circuit produces, in accordance with the result of such calculation, an output signal whose frequency and phase are locked to those of the input signal.

12 Claims, 5 Drawing Sheets

PHASE-LOCKED LOOP CIRCUIT

BACKGROUND OF THE INVENTION

1. Field of the Invention

The present invention relates to a phase-locked loop circuit adapted to produce a stable output signal having the same frequency and phase as those of an input signal.

2. Description of the Prior Art

FIG. 1 is a block diagram of a conventional phase-locked loop circuit disclosed in, for example, Takeshi Yanagisawa, "PPL (Phase-Locked Loop) Applied Circuit", General Electronics Publishing Co., Ltd. May 20, 1983, pp. 28–29. In this diagram, a phase comparator 18 receives both a rectangular signal P1 having a target frequency and a feedback signal P2. Meanwhile a frequency switching gate circuit 19 receives an output signal q of the phase comparator 18 and gate clock pulses fl and gl. Then an N-stage frequency divider 20 receives an output signal R of the frequency switching gate circuit 19, i.e. a composite signal of the gate clock pulses fl and gl, and produces an output signal P2 which is fed back to the phase comparator 18.

Now the operation of such circuit will be described below with reference to FIGS. 2 and 3. In regard to the rectangular signal P1 supplied as an input signal, the input and output of the phase comparator 18 have waveforms represented by (a) and (c) in FIG. 3 respectively. Such input and output waveforms are derived from the phase comparator 18 comprising an SR type flip-flop of FIG. 2 which is set by the rising edge of the rectangular signal P1 and is reset by the rising edge of the feedback signal P2 to consequently produce an output signal q. Denoted by $\phi$ in FIG. 3 is a time difference between the rising edges of the two signals.

The frequency switching gate circuit 19 selectively outputs a gate clock pulse fl of a frequency fl in response to an input level "1" or a gate clock pulse gl of a frequency gl in response to an input level "0", and then supplies the output to the N-stage frequency divider 20. Subsequently the frequency-divided signal from the N-stage frequency divider 20 is partially returned as a feedback signal P2 to the phase comparator 18. That is, the phase difference between the input signal P1 and the feedback signal P2 is detected from the rising edges of the two signals, and in accordance with such phase relationship detected, the ratio between the "1" level and the "0" level (ratio between fl and gl) is changed as represented by the gate clock pulses fl and gl of FIG. 3 (d), thereby controlling both the frequency and the phase of the feedback signal P2.

Thus, due to the technique of mutually comparing the rising edges of the target signal P1 and the feedback signal P2 as described above, it becomes possible to obtain an output synchronized with the rectangular signal P1 having a target frequency.

Since the conventional phase-locked loop circuit has such constitution mentioned above, the input signal (rectangular signal P1) is controlled merely once per cycle to consequently raise a problem that a satisfactory follow-up characteristic is not attainable with regard to variations in the input signal P1.

SUMMARY OF THE INVENTION

The present invention has been accomplished for solving the problems observed in the prior art mentioned. And its object resides in providing an improved phase-locked loop circuit which is capable of enhancing the follow-up characteristic and the precision with respect to any variations caused in the input signal.

In the phase-locked loop circuit of the present invention, a phase comparator is formed so as to produce output phase difference data twice per cycle of an input signal by comparing the falling edge of a feedback signal with the rising edge of the input signal, and a phase control calculation is executed by calculator means, which comprises a microcomputer circuit or the like, on the basis of the phase difference data thus obtained, wherein the feedback signal is outputted from a variable-frequency oscillator in accordance with the result of such calculation.

DETAILED DESCRIPTION OF THE PREFERRED EMBODIMENTS

Figure 1:
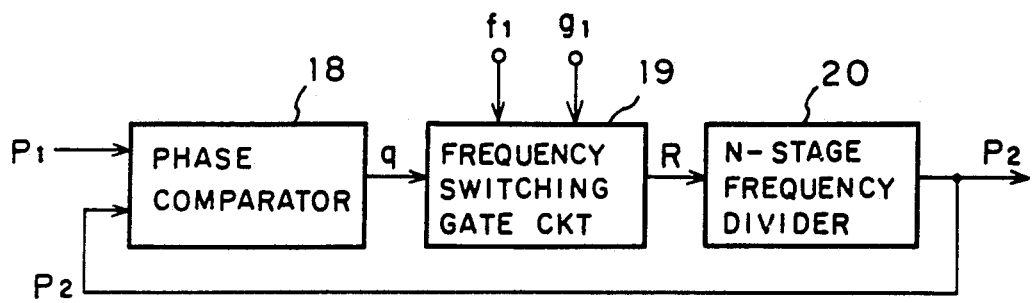
FIG. 1 is a block diagram showing the entire constitution of a conventional phase-locked loop circuit.
Figure 2:
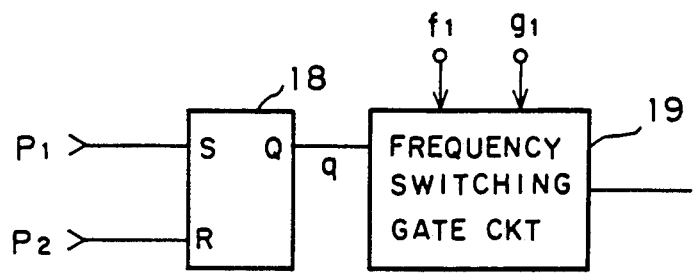
FIG. 2 is an exemplary circuit diagram of the phase comparator shown in FIG. 1.
Figure 3:
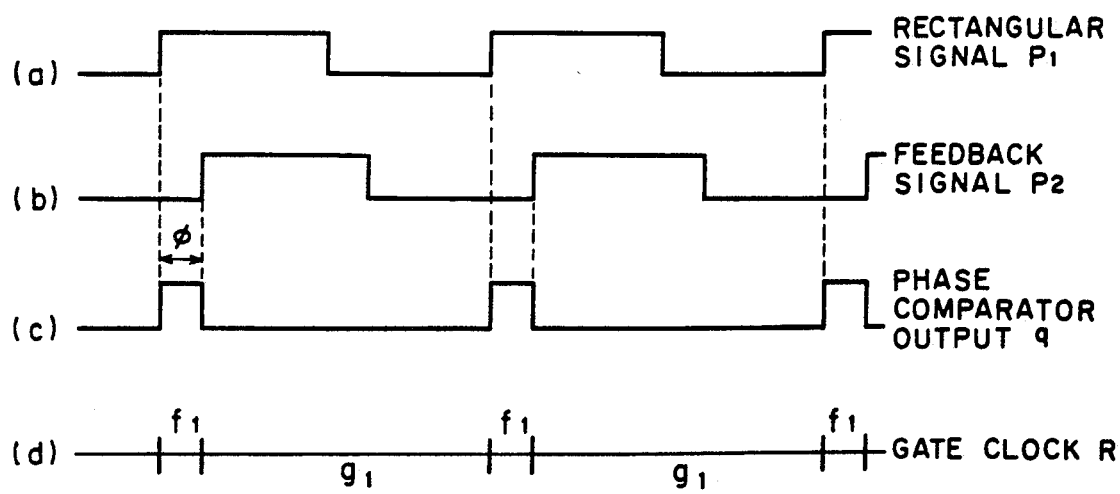
FIG. 3 graphically represents the waveforms of input and output signals in the circuit of FIG. 2.
Figure 4:
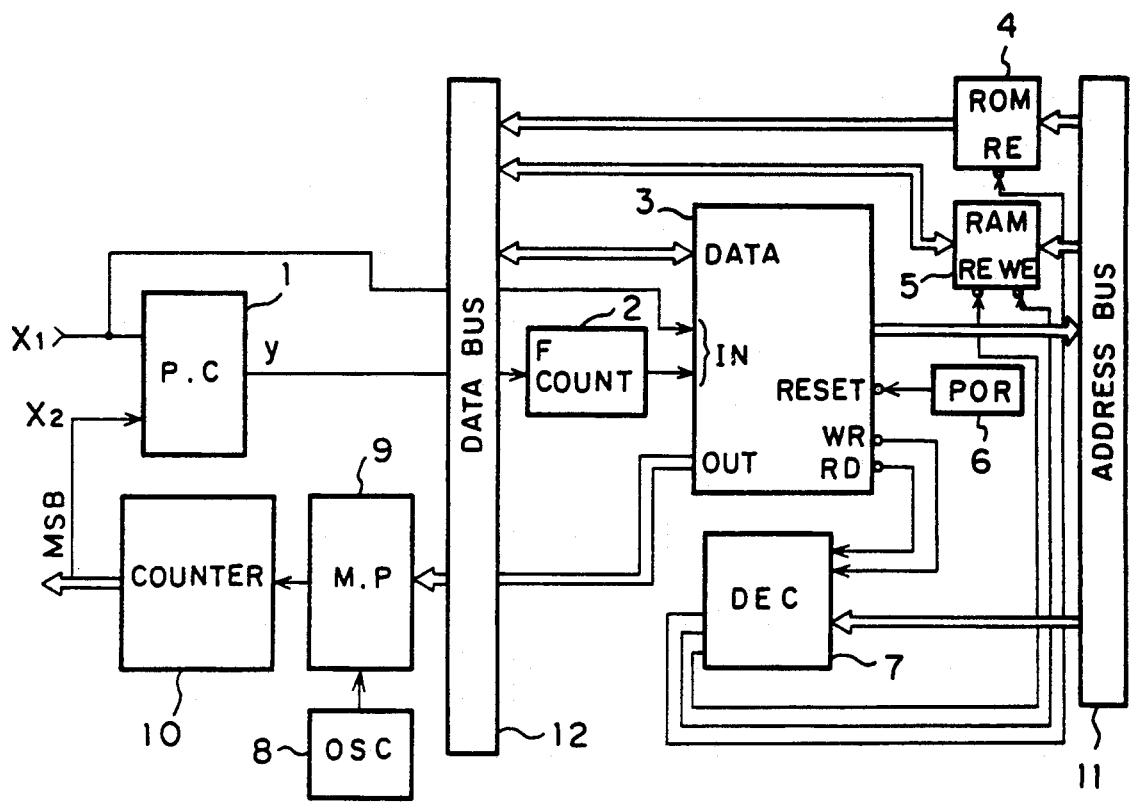
FIG. 4 is a circuit diagram showing the entire constitution of a first embodiment of the phase-locked loop circuit according to the present invention.

Hereinafter a preferred embodiment of the present invention will be described with reference to the accompanying drawings. Denoted by 1 in FIG. 4 is a phase comparator which comprises a flip-flop 1a and an inverter 1b as illustrated in further detail in FIG. 5. The phase comparator 1 receives both a rectangular signal x1 having a target frequency and a most significant bit (MSB) signal x2 of the output from a counter 10, that serves to detect the phase difference data between the two input signals twice per cycle, and provides such phase difference data as an output. In FIG. 4, there are also shown a pulse width measuring circuit 2 consisting of a counter to count internal clock pulses and serving to convert the pulse width of the rectangular signal x1 into a numerical value proportional thereto; a microcomputer 3 functioning as a calculation circuit to execute a phase control calculation; a read-only memory (ROM) 4 where software for phase lock is stored; a random access memory (RAM) 5 for temporarily storing data therein; a reset circuit 6 for resetting the microcomputer 3 at the time of starting the operation thereof; and an address decoder 7 for selecting an address. More specifically, the address decoder 7 is provided with a read signal (RD) and a write signal (WR)

from the microcomputer 3 while accepting address data from an address bus 11 and supplies both a read enable signal (RE) and a write enable signal (WE) to the ROM 4 and the RAM 5. There are further shown a crystal oscillator 8; a rate multiplier 9 functioning as a variable-frequency oscillation circuit to produce an output of a frequency conforming to the output of the microcomputer 3 on the basis of the output frequency of the crystal oscillator 8; and an 8-bit counter 10 for producing an output whose MSB signal x2 is returned as a feedback signal to the phase comparator 1.

Figure 6:
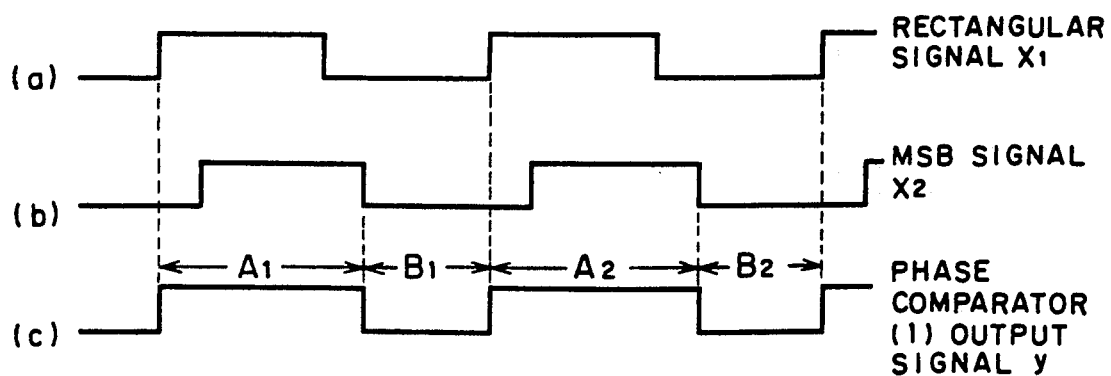
FIG. 6 graphically represents the waveforms of input and output signals in the circuit of FIG. 5.
Figure 7:
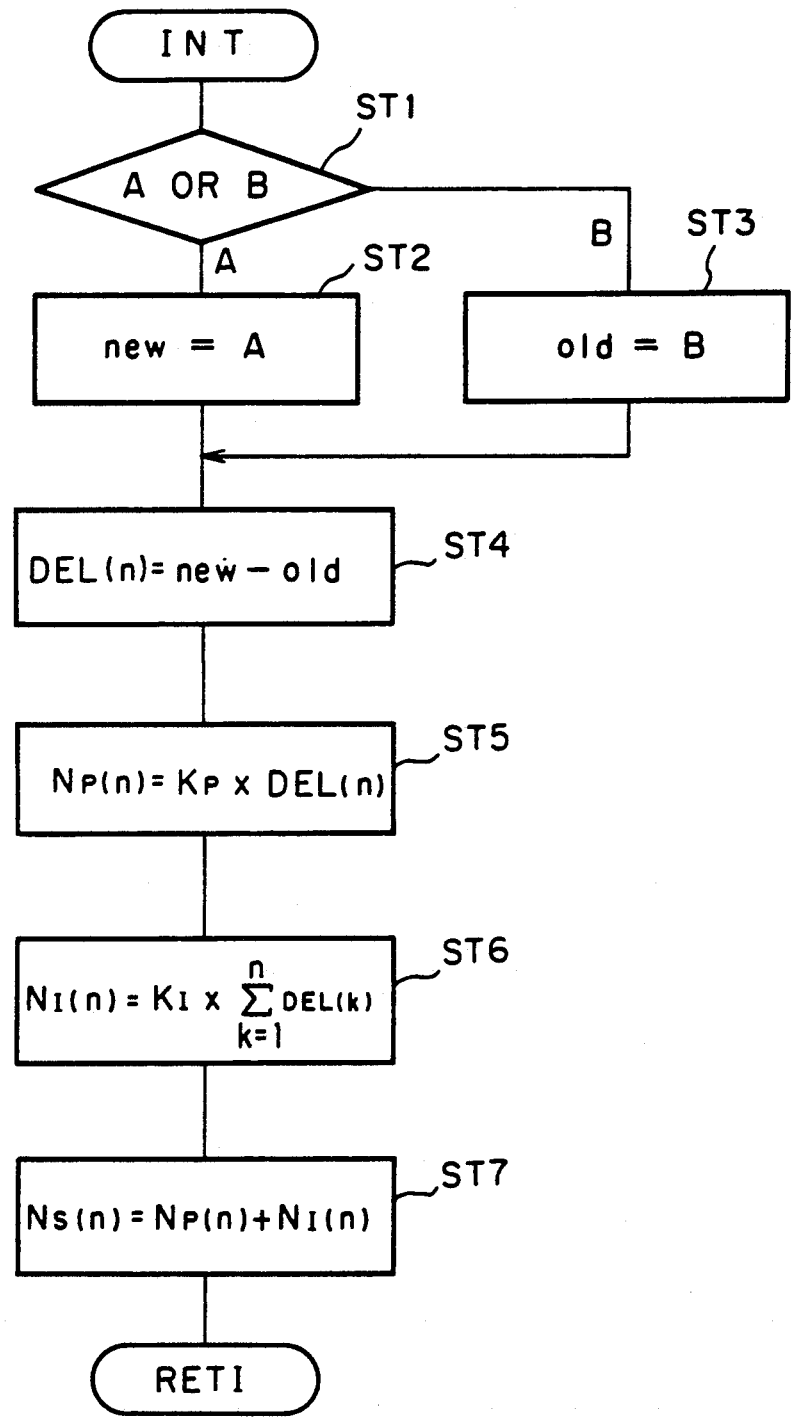
FIG. 7 is a flow chart of a processing program executed by the microcomputer shown in FIG. 4.

The operation performed in the above embodiment will be described below with reference to FIGS. 5 to 7.

Figure 5:
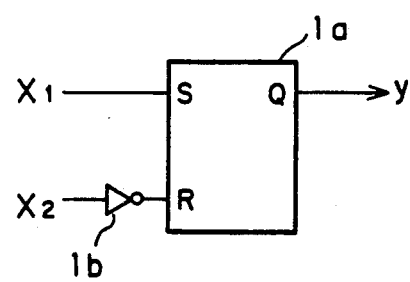
FIG. 5 is an exemplary circuit diagram of the phase comparator shown in FIG. 4.

FIG. 5 is a detailed circuit diagram of the phase comparator 1 comprising a flip-flop 1a and an inverter 1b; FIG. 6 graphically represents the waveforms of input and output signals in the phase comparator 1; and FIG. 7 is a flow chart of a phase lock program stored in the ROM 4.

In the phase comparator 1, the phase of the MSB signal x2 for feedback signal is compared with that of the rectangular signal x1 having a target frequency. For example, in case the rectangular signal x1 of FIG. 6 (a) is inputted, the flip-flop 1a is set by the rising edge of the signal x1 and is reset by the falling edge of the signal x2 via the inverter 1b in the circuit of FIG. 5, thereby producing an output signal y shown in FIG. 6 (c), where the duration of "1" is defined as A and the duration of "0" as B respectively.

In the pulse width measuring circuit 2, the durations A and B (represented by A1, A2 and B1, B2 in this example) are measured by the technique of counting internal clock pulses during the respective time periods of the pulse widths A and B and then converting the pulse widths into corresponding numerical values. Subsequently such numerical values are fed to the microcomputer 3.

Now a description will be given below with regard to the program in the flow chart of FIG. 7 executed by the microcomputer 3 on the basis of the measured value obtained from the pulse width measuring circuit 2. First the value fed to the microcomputer 3 is judged to be A or B in step ST1. And in accordance with the result, the value A is stored in a register "new" in step ST2, or the value B is stored in a register "old" in step ST3. Subsequently the value in the register old is subtracted from the value in the register new in step ST4, and the difference thus obtained is set in a register DEL(n). Consequently the difference between A and B, i.e. the phase difference between x1 and x2, is calculated in steps ST1 through ST4 where the value A is applied as a reference. Therefore, $$DEL(1) = A1 - B1$$

$$DEL(2) = A2 - B1$$

$$DEL(3) = A2 - B2$$

$$DEL(4) = A3 - B2$$

$$DEL(n) = A[INT(n/2) + 1] - B[INT((n+1)/2)]$$

In steps ST5 through ST7, there is performed a proportional plus integral control action. First in step ST5, the product of the phase difference DEL (n) and the proportional gain Kp is calculated to be applied as a proportional control element Np. Then in step ST6, the product $$K1 \cdot \sum_{k=1}^{n} DEL(k)$$

of the sum of the phase differences DEL(n) and the integral gain K1 is calculated to be applied as an integral control element NI. And in next step ST7, the sum Ns of the proportional control element Np and the integral control element NI is calculated to be outputted to the microcomputer 3. This program can be realized, for example, as an interrupt processing program started at the termination of the duration A or the duration B.

Subsequently the oscillation frequency of the crystal oscillator 8 is converted by the rate multiplier 9 into a frequency signal conforming to the output of the microcomputer 3 and, after the frequency thereof is divided by the counter 10, the MSB signal of its output is returned as a feedback signal x2 to the phase comparator 1.

With repetition of the above operation, the phase difference is accumulated in the integral element NI for proportional plus integral control, so that the phases of the signals x1 and x2 are gradually approximated to each other to eventually equalize B to A. And upon coincidence of B with A, the phase difference is completely eliminated to cause a phase-locked state between the two signals x1 and x2.

In the above embodiment, the resultant signal, which is obtained by comparing the phase of the MSB signal for feedback signal of the counter 10 with the phase of the rectangular signal having a target frequency, is applied as an input signal to the microcomputer 3. However, the above circuit constitution may be so modified as to perform a phase lock operation without the necessity of the phase comparator 1 by inputting the rectangular signal and the MSB signal directly to the microcomputer 3 and executing the phase comparison procedure with software.

Figure 8:
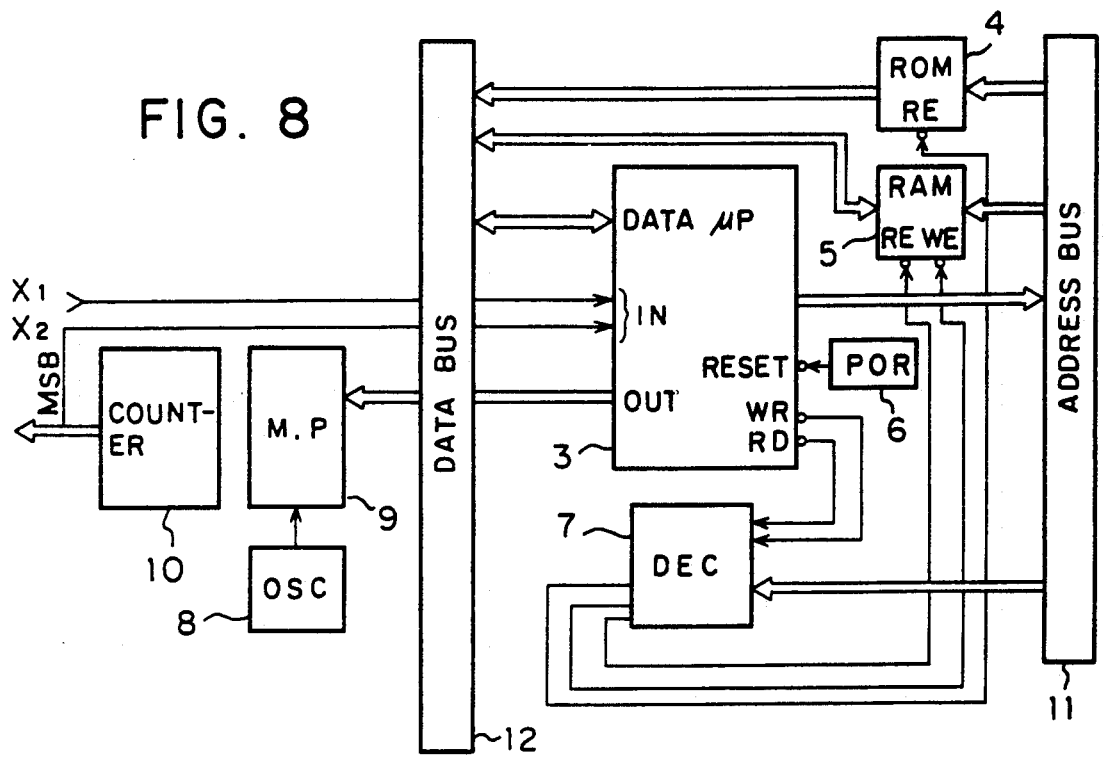
FIG. 8 is a circuit diagram showing the entire constitution of a second embodiment of the phase-locked loop circuit according to the invention.
Figure 9:
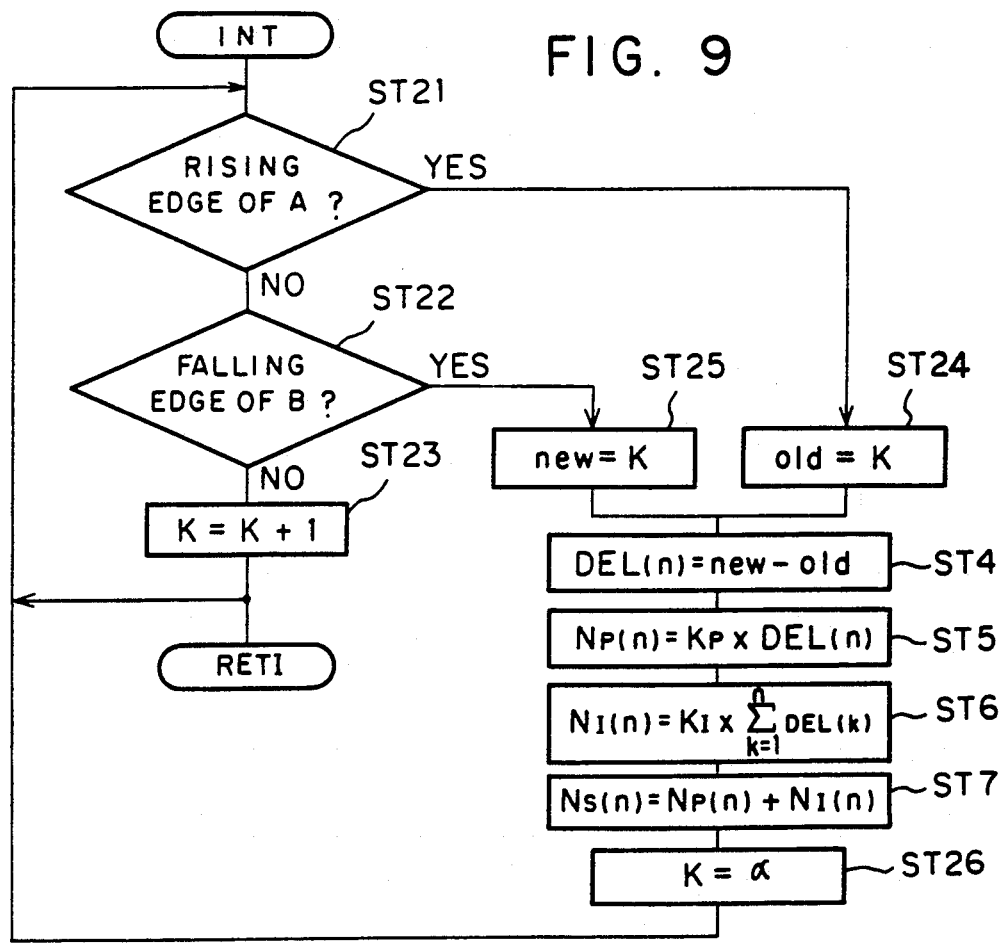
FIG. 9 is a flow chart of a processing program executed by the microcomputer shown in FIG. 8.

FIG. 8 shows a block diagram of a second embodiment having such modified constitution described above. In this diagram, the phase comparator 1 and the pulse width measuring circuit 2 employed in the foregoing embodiment of FIG. 4 are removed, and both the rectangular signal x1 and the MSB signal x2 are inputted directly to the microcomputer 3. Shown in FIG. 9 is a flow chart of software programmed to perform a phase lock operation in the constitution of FIG. 8.

Now the operation of the second embodiment will be described below with reference to FIG. 9. First, in case neither the rising edge signal of A nor the falling edge signal of B is inputted, merely the content value of a counter K is incremented. When either of such edge signals is inputted, the rising edge signal of A is processed in step ST24 where the value of the counter K is stored in the register "old", or the falling edge signal of B is processed in step ST25 where the value of the counter K is stored in the register "new". Subsequently in steps ST4 through ST7, a proportional plus integral control action is executed in the same manner as in the first embodiment, and the result is outputted to the rate multiplier 9. In the next step ST26, the count value K is replaced with the value of the required processing time $\alpha$ in steps ST21, ST22, ST24 or ST25 and ST4 through ST7, and the time having elapsed during such procedure is applied as a correction value for the count value K. Thus, this program normally functions as a counter and, when the rising edge signal of A or the falling edge signal of B is inputted, a proportional plus integral control action is executed to attain a coincidence between the phases of the signals x1 and x2. This software includes an interrupt processing program started at the rise time of A and the fall time of B.

Figure 10:
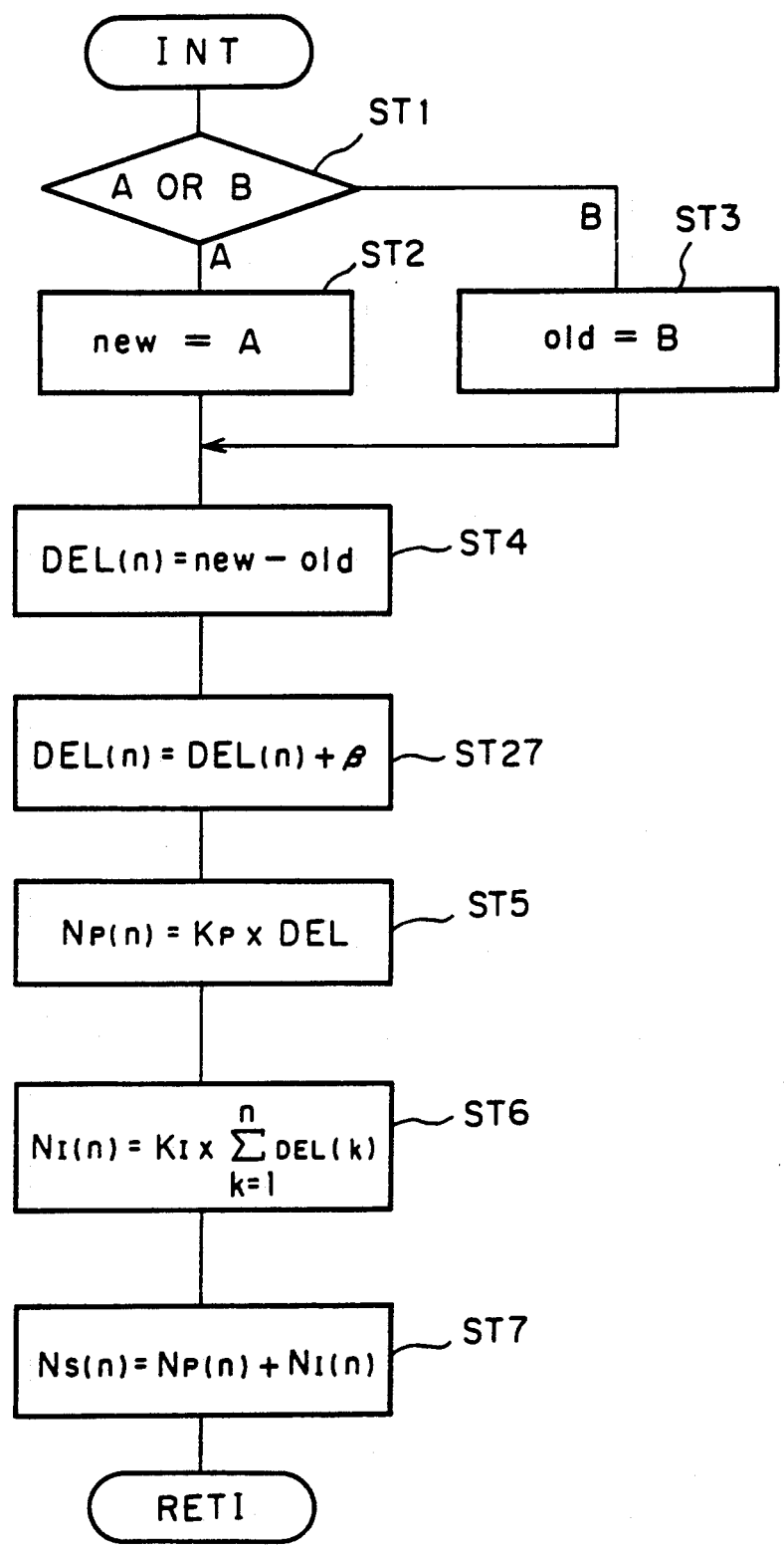
FIG. 10 is a flow chart of a processing program executed by the microcomputer in a third embodiment of the phase-locked loop circuit according to the invention.

In the second embodiment mentioned above, the control action is so performed as to eliminate the phase difference between the rectangular signal x1 and the feedback signal x2. However, if step ST27 is additionally inserted between the aforementioned steps ST14 and ST15 as shown in FIG. 10 to execute the following calculation $$DEL(n)=DEL(n)+\beta$$

then it becomes possible to obtain a phase difference corresponding to the value $\beta$. Therefore, the phase difference can be changed as desired by properly changing the value $\beta$. The value $\beta$ is supplied from a port (not shown) connected to the bus of the microcomputer 3.

What is claimed is:

1. A phase-locked loop circuit, comprising:
    phase comparator means for detecting a phase difference between an input signal and a feedback signal and for outputting the resultant phase difference data twice per each cycle of said input signal;
    calculator means for executing a phase control calculation based on the output of said phase comparator means; and
    a variable-frequency oscillator circuit for producing an output signal of a frequency conforming to the result of calculation of said calculator means.

2. A phase-locked loop circuit according to claim 1, wherein said phase comparator means includes a phase comparator circuit for detecting a rising edge of the input signal and a falling edge of the feedback signal and for outputting the two edges thereof, and said phase-locked loop circuit further comprises a pulse width measuring circuit for measuring two time periods between said edges.

3. A phase-locked loop circuit according to claim 2, wherein said phase comparator circuit is a flip-flop connected so that said input signal is fed to a set input thereof while said feedback signal is fed to a reset input thereof via an inverter.

4. A phase-locked loop circuit according to claim 2 or 3, wherein said pulse width measuring circuit receives a fixed-frequency signal, then counts the cycles thereof during each of said two time periods, and outputs both a first value indicative of the number of counted cycles from said rising edge and a second counted value indicative of the number of counted cycles from said falling edge.

5. A phase-locked loop circuit according to claim 4, wherein said calculator means is a microprocessor circuit having, in its memory unit, a subtraction program for subtracting said second counted value from said first counted value, and also a proportional plus integral calculation program for executing a proportional plus integral calculation based on the result of calculation of said subtraction program.

6. A phase-locked loop circuit according to claim 1, wherein said phase comparator means is a microprocessor circuit having, in its memory unit, a phase comparison program for detecting a rising edge of said input signal and a falling edge of said feedback signal, then measuring a time period between the detected two edges, and determining a phase difference between said input signal and said feedback signal using both a first measured value started from said rising edge and a second measured value started from said falling edge.

7. A phase-locked loop circuit according to claim 6, wherein said phase comparison program is so arranged as to output a first counted value as said first measured value by counting the number of periodic interrupts from said rising edge, and also to output a second counted value as said second measured value by counting the number of periodic interrupts from said falling edge.

8. A phase-locked loop circuit according to claim 7, wherein said calculator means comprises a subtraction program in said memory unit of said microprocessor circuit for subtracting said second counted value from said first counted value, and also a proportional plus integral calculation program for executing a proportional plus integral calculation based on the result of calculation of said subtraction program.

9. A phase-locked loop circuit according to claim 7 or 5, wherein said microprocessor circuit further has, in the memory unit, a phase difference setting program for adding a predetermined value to or subtracting the same from the result of said subtraction program.

10. A phase-locked loop circuit according to claim 9, wherein said memory unit is a read-only memory (ROM).

11. A phase-locked loop circuit according to claim 8 or 5, wherein said memory unit is a read-only memory (ROM).

12. A phase-locked loop circuit according to claim 11, wherein said variable-frequency oscillator circuit includes a rate multiplier for frequency-dividing an output signal of a crystal oscillator based on the result of calculation of said proportional plus integral calculation program.

* * * * *

UNITED STATES PATENT AND TRADEMARK OFFICE
CERTIFICATE OF CORRECTION

PATENT NO. : 5,005,141

DATED : April 2, 1991

INVENTOR(S) : Kazunori Sanada et al.

It is certified that error appears in the above-identified patent and that said Letters Patent is hereby corrected as shown below:

Column 2, line 3, delete "caused".

Column 4, line 10, "NI" should be $--N_I--$;

line 22, "NI" should be $--N_I--$.

Signed and Sealed this

Eighth Day of September, 1992

Attest:

DOUGLAS B. COMER

Attesting Officer

Acting Commissioner of Patents and Trademarks